(12) United States Patent
Bodette et al.

(10) Patent No.: US 6,195,262 B1
(45) Date of Patent: Feb. 27, 2001

(54) LOW PROFILE COMPUTER OR COMMUNICATIONS NETWORK INTERCONNECTING DEVICE AND HOUSING THEREFOR

(75) Inventors: Edward James Bodette, Holly Springs; John Gary Bulluck, Apex; Christopher Lee Durham, Mebane; Anthony Wayne Miles, Raleigh; Brian Scott Oakley, Burlington, all of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/118,027

(22) Filed: Jul. 17, 1998

Related U.S. Application Data

(60) Provisional application No. 60/080,280, filed on Apr. 1, 1998.

(51) Int. Cl.$^7$ ........................................ H05K 7/14
(52) U.S. Cl. .................. 361/752; 361/741; 361/728; 361/801
(58) Field of Search ................... 361/752, 741, 361/742, 756, 758, 683–687, 801, 802, 728, 736, 759, 753, 796, 825

(56) References Cited

U.S. PATENT DOCUMENTS

| | | | | |
|---|---|---|---|---|
| 5,121,296 | * | 6/1992 | Hsu ........................................ | 361/395 |
| 5,536,905 | * | 7/1996 | Redman et al. ....................... | 361/816 |
| 5,689,406 | * | 11/1997 | Wood et al. ......................... | 361/796 |
| 5,912,799 | * | 6/1999 | Grouell et al. ....................... | 361/685 |

* cited by examiner

*Primary Examiner*—Leo P. Picard
*Assistant Examiner*—Hung Van Duong
(74) *Attorney, Agent, or Firm*—Jocelyn G. Cockburn

(57) ABSTRACT

An electrical machine, such as a computer, network interconnecting device, etc., has an enclosure fabricated from a one piece material fold and cut into a desired form including sidewalls with an opening in one of the sidewalls and projections to which other components are connected. The components include a support member and brackets interconnecting the support member to the projections. The support and brackets are arranged to form cavities in which circuit cards can be inserted.

22 Claims, 8 Drawing Sheets

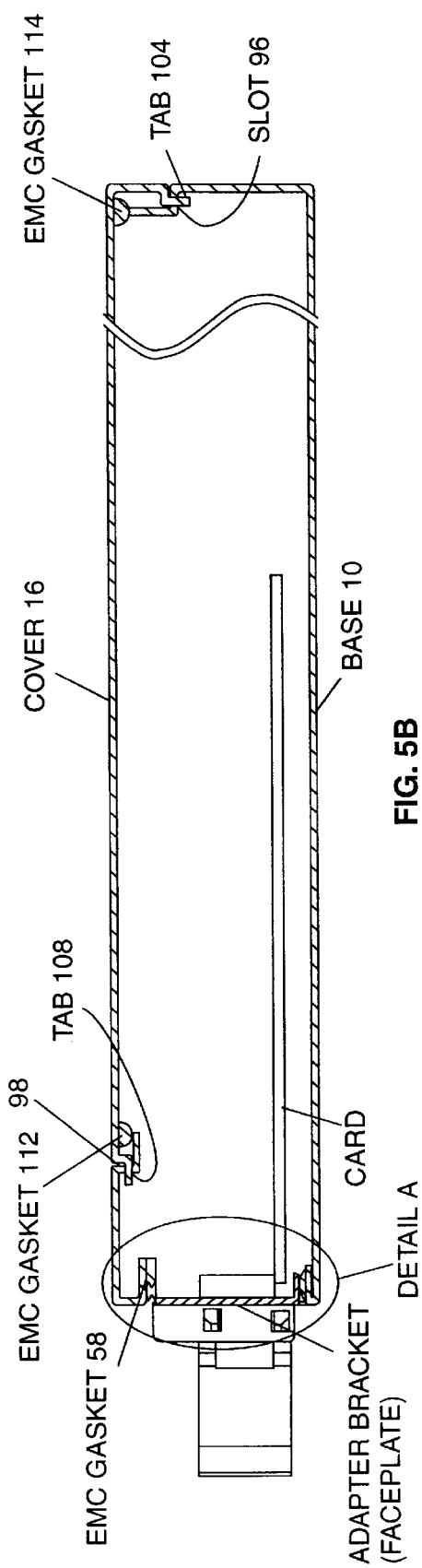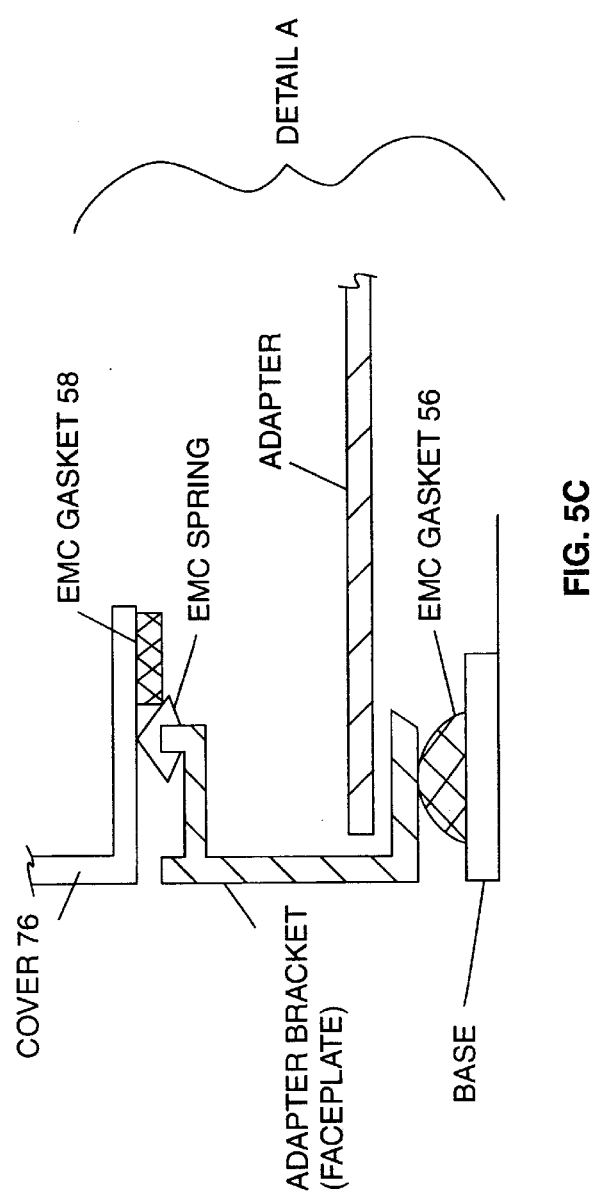
FIG. 5B
FIG. 5C

LOW PROFILE COMPUTER OR COMMUNICATIONS NETWORK INTERCONNECTING DEVICE AND HOUSING THEREFOR

This application claims the benefit of U.S. Provisional Application Ser. No. 60/080,280, filed Apr. 1, 1998.

BACKGROUND OF THE INVENTION

1. Field of the Invention

The present invention relates to electronic packaging in general and, in particular, to electronic packaging of Personal Computers (PC) and other network interconnecting devices.

2. Prior Art

Personal computers and network interconnecting devices such as routers, concentrators, etc. typically have an enclosure in which several components are mounted. Typical components include blowers, hard disk, motherboard, circuit cards, etc. Most of the designs were roll-your-own in that each manufacturer designs its machines to its own liking without regard for interchangeability of parts from other manufacturers. Examples of prior art machines are set forth in U.S. Pat. Nos. 4,916,578; 5,175,669; 5,218,514; 5,519,573; 5,596,483 and 5,600,538.

U.S. Pat. No. 4,916,578 (Personal Computer Chassis Connection Method). This patent shows a box that uses a sliding 4-sided top cover over a 3-sided base with a special interlock detail for EMC sealing. The adapters are vertically oriented and top pluggable, requiring removal of the top cover first. The corner EMC seal is a contact clip.

U.S. Pat. No. 5,175,669 (Support Member that Couples an Electronic Card to a Chassis). This patent shows a mechanism for retaining an adapter card which is installed into a box from the top. The top cover would have to be removed to access the adapter. The mechanism would probably be molded plastic so that it can flex to snap into the retaining slots in the box base. The adapters plug into a mother board and are oriented vertically in the box.

U.S. Pat. No. 5,218,514 (Compact High Power Personal Computer with Improved Air Cooling System). This patent describes a cooling system for a personal computer box that pulls air in through apertures in the front and blows it out the back. It also describes the location of the components within the box such as the power supply and riser board and I/O cards which are horizontally oriented. The patent seems very specific to the product it describes.

U.S. Pat. No. 5,519,573 (I/O Riser Card for Motherboard in Personal Computer/Server). This patent shows a mother board with a vertically oriented riser board for I/O connection attached. The riser board has an EMC gasket (40) mentioned. The description is a compliant die-cut part which has connector exit openings and is sandwiched between the outer box case.

U.S. Pat. No. 5,596,483 (Silent Air Cooled Computer . . . ). This patent claims a very specific means for cooling a hard drive which apparently also reduces noise levels. It claims a fan which is adhesively mounted to an elastic gasket. It also claims a hard drive with a fluid containing pouch.

U.S. Pat. No. 5,600,538 (Personal Computer and Housing Structure . . . ). This patent describes an Apple computer with removable decorative panels and with a removable mother board with a sub-chassis mounted on top. The disk drives are mounted on slides which are accessible from the front exterior of the box after a decorative panel is removed. The patent appears very specific to the Apple product.

There seems to be a trend, in the computer and communications industries, toward open systems whereby hardware would be compatible with other hardware no matter what company makes it. To foster this interchangeability, several companies have formed a consortium called PCI Industrial Computer Manufacturers Group (PICMG™) which promulgates the CompactPCI® (Peripheral Component Interconnect) specification that uses industry standard mechanical components and high performance connector technologies to provide a system intended for rugged environments. Included in the specification is a standard form factor for adapters or boards. Both 3U (100 mm by 160 mm) and 6U (233.35 mm by 160 mm) board size are defined. More details are set forth in the standard which is incorporated herein by reference.

Even though the specification is a step in the right direction in that electronics are packaged on a standardized board that fits enclosures from different manufacturers, the enclosures themselves are built on a "roll-your-own" interchangeable component design. Kits containing mechanical parts for the enclosures can be purchased and assembled. The enclosures are usually expensive due to high cost for the mechanical components and labor costs for manually assembling them. In addition, the fit between parts are variable due to tolerances and to variable assembly positions. Moreover, the appearances are not pleasing; thus, requiring covers that further augment the overall cost. Finally, these "tinker-toy like" enclosures are not very good in providing EMI shielding.

SUMMARY OF THE INVENTION

One of the objects of the present invention is to provide a rugged electrical machine that is compatible with the Compact PCI specification.

It is another object of the invention to provide a low cost enclosure that supports CompactPCI® form factor standard boards.

It is still another object of the present invention to provide an enclosure whose manufacture is fully or partially automated.

It is yet another object of the present invention to provide an enclosure with improved EMI shielding.

The electrical machine includes an enclosure, components mounted in the enclosure and EMI shielding to control electromagnetic interferences (EMI).

The enclosure includes a base section with spaced horizontal slots fabricated along the front of the base and spaced vertical slots fabricated along the top rear of the base. The cover section includes tabs positioned on the front and back edge. The tabs are fabricated to be inserted in the slots when the cover section is placed on the base section. The tabs and associated slots are part of the EMI shielding system that is further enhanced by conductive gaskets disposed relative to the tabs on the cover.

The base further includes a support, for mounting the backplane card, connected to the base. A plurality of spaced card rail brackets are connected between the support and the access opening in the front wall of the base. The card rail brackets also provide grounding and latching surfaces for the card brackets and injector/ejector lever mechanism. The card rail brackets are arranged to provide access openings for different size circuit boards. Card guides, upon which the circuit boards ride, are fitted on the card rail brackets.

Grounding clips for grounding the circuit board are provided in the card guides.

The above, as well as additional objects, features and advantages of the present invention, will become apparent in the following description.

BRIEF DESCRIPTION OF THE DRAWINGS

FIG. 5B shows a section across FIG. 5A.

FIG. 5C shows detail A from FIG. 5B.

DETAILED DESCRIPTION OF THE INVENTION

An interconnecting device, such as a router, concentrator, bridge, etc., is shown and described herein. The structure and packaging could be used for a personal computer (PC), word processor or similar electronic equipment. The PC, word processor or similar electronic equipment are referred to as table top devices; whereas, the interconnecting devices are referred to medium access control (MAC) devices used in the infrastructure of networks. For purposes of illustration, the invention is described as a rack mount interconnecting device. However, this should not be construed as a limitation on the scope of the present invention because it is well within the skills of one skilled in the art to use the teachings described hereinafter to fabricate table top and other devices. Any such usage is intended to be covered by the description and claims of the present invention.

Figure 3A:
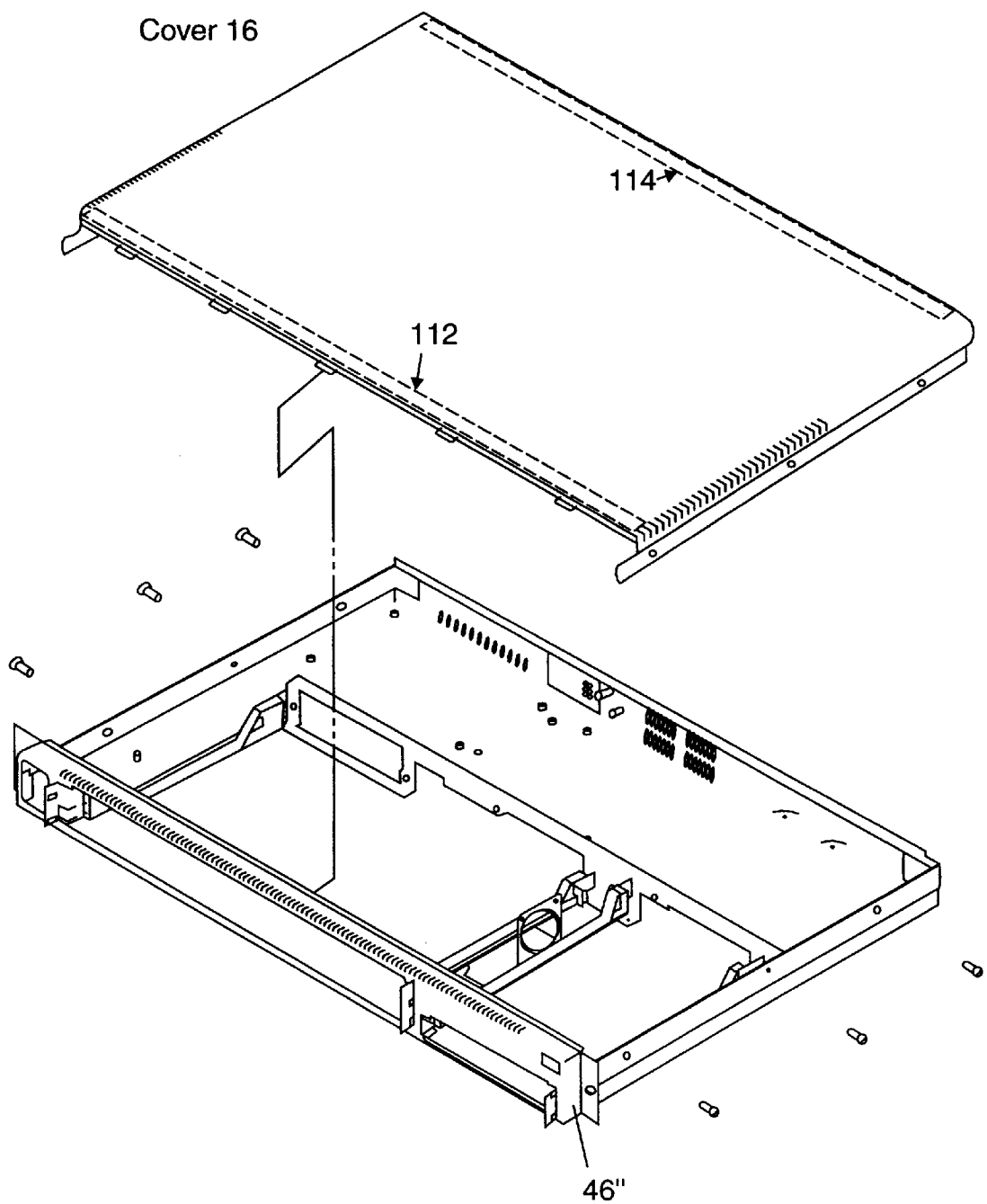
FIG. 3A shows a graphical representation of the EMI shielding according to the teachings of the present invention.
Figure 3B:
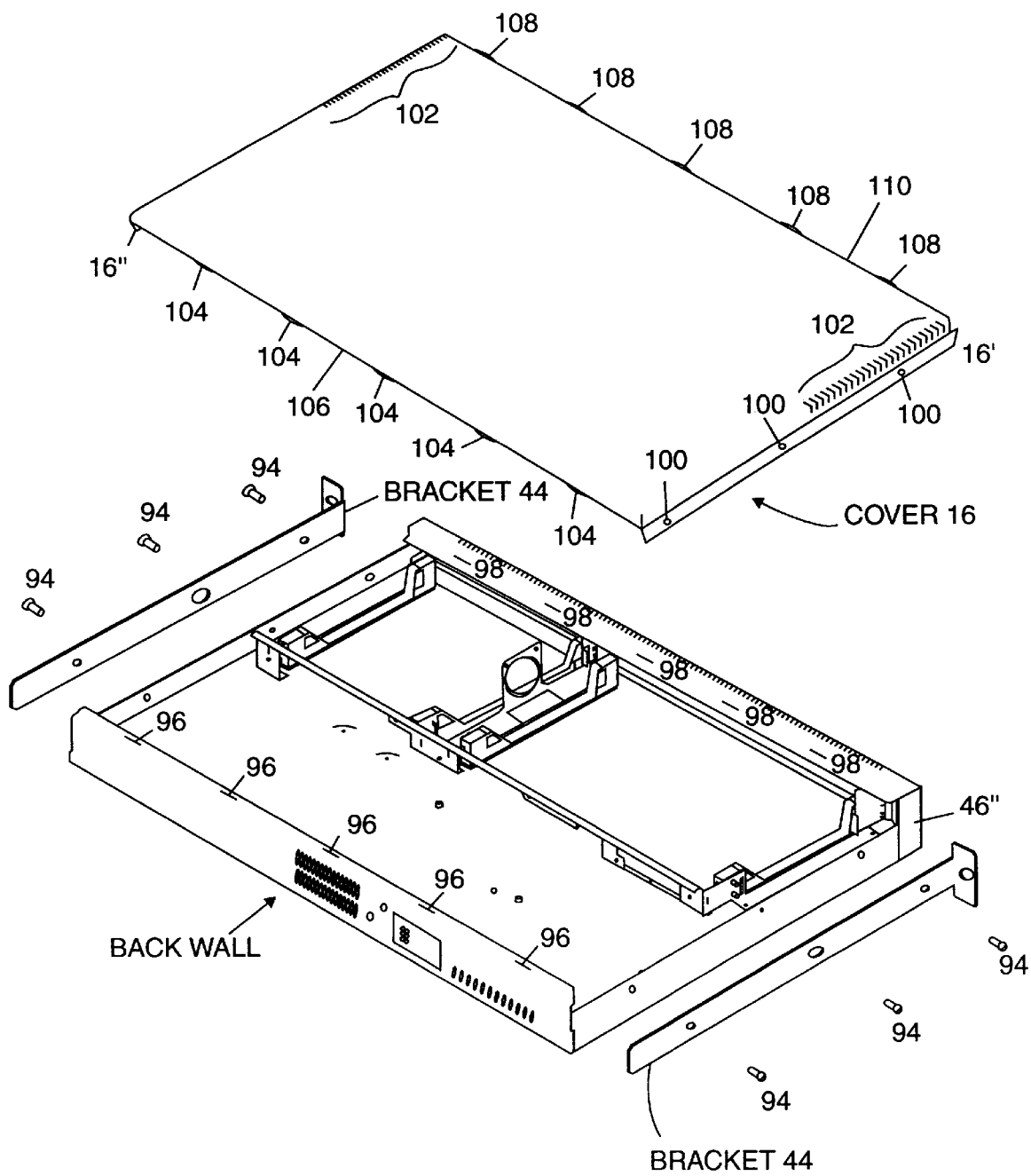
FIG. 3B shows additional details of the EMI shielding feature of the present invention.
Figure 4A:
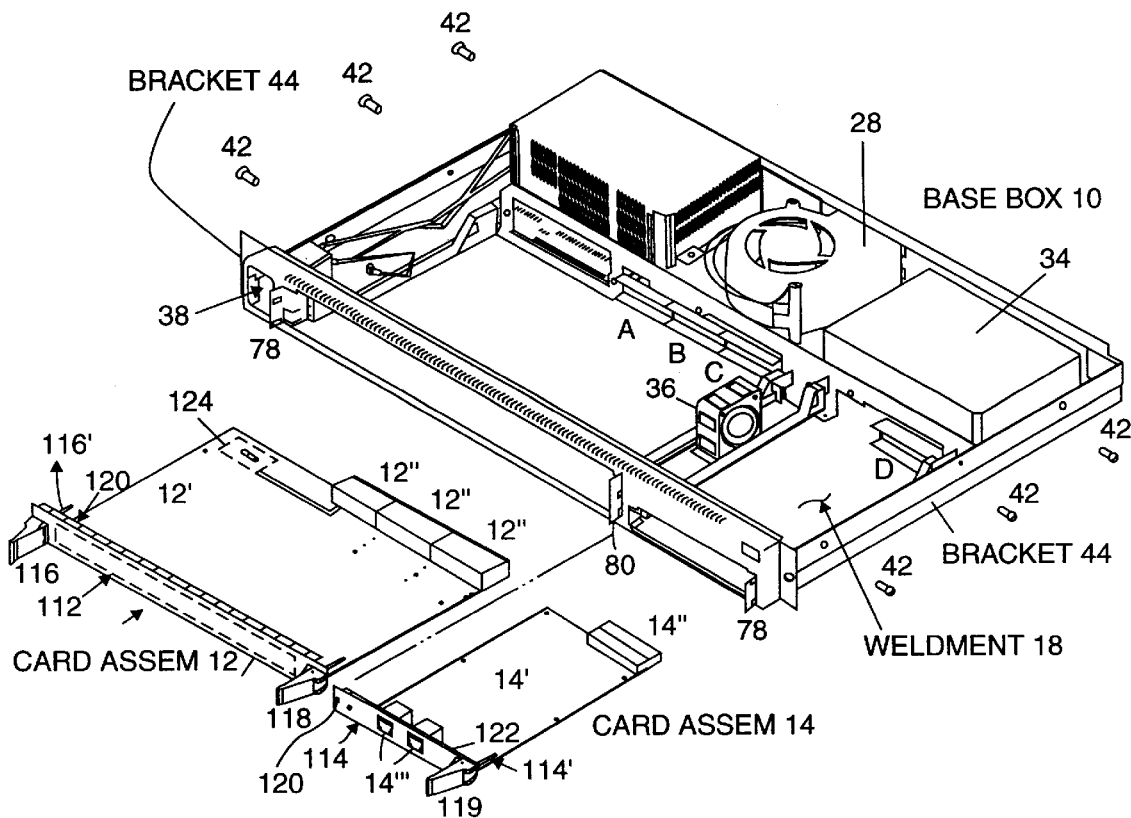
FIG. 4A shows a partially assembled electrical machine according to the teachings of the present invention.

FIGS. 1 through 4A show exploded views of a MAC device according to the teachings of the present invention. In these and other views of this invention, common elements are identified by the same numeral. The MAC device includes a base box 10, adapter cards 12 and 14 displaced from the base box (FIG. 4A) and cover 16 (FIG. 3A). The details of the various components will be given hereinafter. Suffice it to say that card 12 and card 14 carry electronic circuities that perform the functions that the box is designed to do. The cards are of different sizes. When inserted in base box (FIG. 4A) and the cover 16 is placed on the box, the assembled structure is shown in FIG. 5A. It should be noted that the small card 14 is not shown in FIG. 5A. The vacant space is shown for purposes of contrast between the inserted card 12 and the non-inserted card 14.

Figure 1:
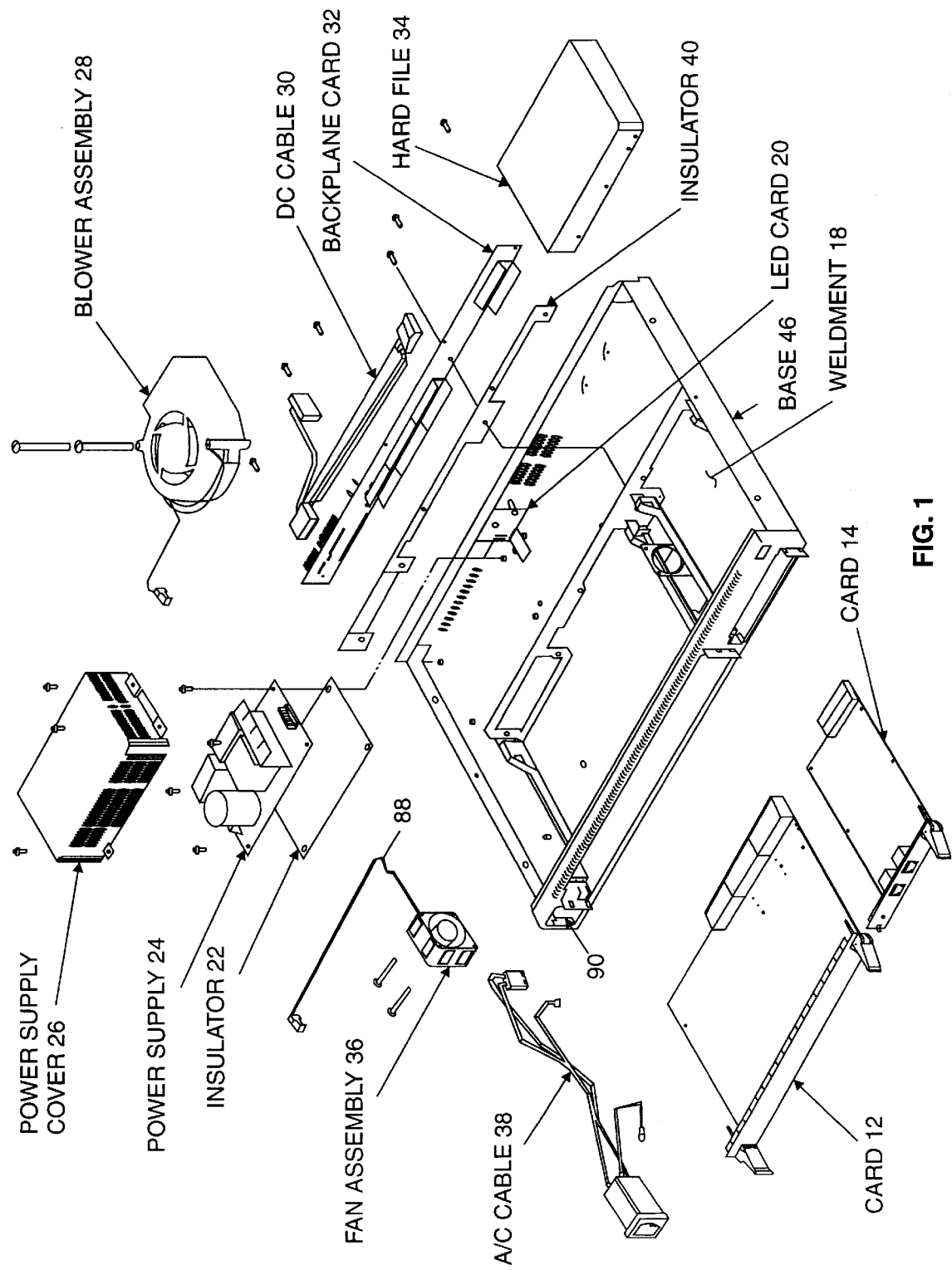
FIG. 1 shows an exploded view of the enclosure and the electrical machine formed therefrom according to the teachings of the present invention.

Turning to FIG. 1 for the moment, an exploded view of the MAC device is shown. The cover is not shown in FIG. 1. The MAC devices includes weldment 18, LED card 20, insulator 22, power supply 24, power supply cover 26, blower assembly 28, DC cable 30, backplane card 32, hardfile 34, fan assembly 36, AC cable 38, card 12, card 14 and a plurality of fasteners, including screws for attaching the named components to weldment 18. It should be noted that the base box 10 (FIG. 4A) is a partially assembled MAC device comprising weldment 18, insulator 22, power supply 24, power supply cover 26, AC cable receptable 38, fan assembly 36, blower assembly 28, hard file 34, insulator 40 and backplane card 32. A plurality of fasteners, such as screws 42, can be used to attach brackets 44 and 46 to the weldment 18. The brackets are used for mounting the MAC device in a rack (not shown).

Figure 2:
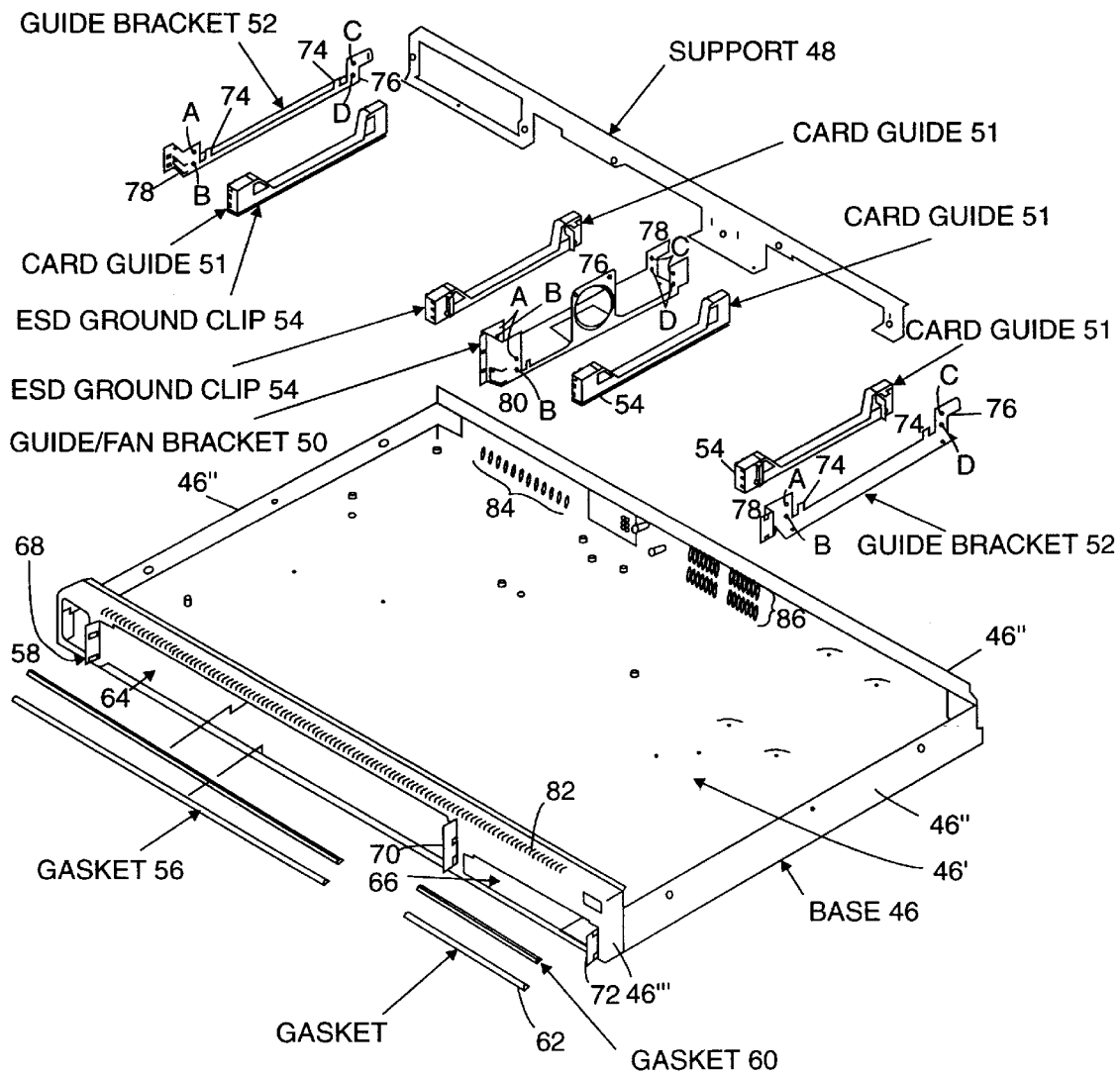
FIG. 2 shows an exploded view of the base section (called a weldment) according to the teachings of the present invention.

Turning to FIG. 2, an exploded view of the weldment (FIG. 1) is shown. The weldment includes base 46, support 48, guide/fan bracket 50, card guide 51, guide bracket 52, ESD ground clip 54. Two sets of gaskets labeled 56, 58, 60 and 62 are also provided. As will be explained subsequently, the gaskets provide electromagnetic shielding inside the box.

Still referring to FIG. 2, the base 46 is fabricated from a single sheet of metal folded and cut to provide the form shown in the figures. In particular, the metal is folded to provide a bottom 46', sidewalls 46" and front section 46'". The front section includes openings 64 and 66, respectively. The openings are the entrance through which cards 12 and 14 (detailed to be given hereinafter) are inserted. The openings are of different sizes so that they can accommodate different size cards. With regard to the above incorporated CompactPCI® form factor standard, the card or adapter that is inserted in opening 64 is referred to as a 6U card. Likewise, the card that is inserted in opening 66 is referred to as a 3U card. In other words, the openings accept CompactPCI® form factor cards. Of course, the openings could be sized to accept other types of cards without deviating from the teachings of the present invention. The single piece of metal used for base 46 is folded to provide extension members 68, 70 and 72. As will be described in more details here below, the guide brackets are fabricated with end pieces which are fastened (welded) onto the extension members 68, 70 and 72, respectively. As a consequence, when the weldment is formed, the structure is extremely strong, supports large connectors mounted to support 48 and can be mounted in places (such as racks) where rugged machine frames are required.

Still referring to FIG. 2, each of the guide brackets 52 are fabricated from sheet metal and include grounding pins 74, ends 76 for connecting to the support 48, and ends 78 for connecting with extension members 68 and 72, respectively. The end 78 also provides the surface which coacts with the injector/ejector lever mechanism on the card bracket to insert or remove the card from the connector in the backplane card. The guide/fan bracket 50 is also fabricated from metal and has a cradle 76 in which the blower fan assembly 36 (FIG. 1) is placed, ends 78 for connecting to the support 48 and ends 80 for connecting to extension member 70 in the base 46. Each of the card guides 51, is preferably fabricated from plastic and include an ESD ground clip 54 which is metal and coacts with pin 74 on each of the guide brackets and a metal strip on each to provide the grounding to the card. Cooling vents identified by numerals 82, 84 and 86 are fabricated in the base 46. As will be explained subsequently, when the system is assembled, the cooling vents provide the cooling by allowing air to enter and leave the box freely.

Still referring to FIG. 2, in assembling the structure, the card guide 51 has mounting posts which snap into mating holes A, B, C and D on their respective guide brackets. The ESD ground clip 54 is now in contact with grounding pin 74 and provides grounding to the card by contacting a metal strip provided on each of the cards. The support 48 is then connected to the bottom 46'. One of the guide brackets 52 and connected card guide 51 is mounted to the bottom of base 46 in space alignment with sidewall 46". The other guide bracket 52 and its connected card guide 51 is connected to the inside surface of sidewall 46'". The guide/fan bracket 50 and its attached card guides 51 are mounted to bottom 46'. The end of each of the guide brackets adjoining the support 48 are firmly connected to the support. The other end of each of the card guides is positioned so that they are in alignment with extension members 72, 70 and 68 respectively. The ends and the extension members are then welded or fastened together. After assembling the components shown in FIG. 2, the weldment 18, (FIG. 1) is fabricated.

Referring again to FIG. 1, once the weldment is formed, the assembling is continued by mounting insulator 22, power supply 24 and power supply cover 26 with the appropriate fasteners into the base. The insulator 40, backplane card 32 containing connectors, interconnecting conductors, etc., are mounted to the support 48 (FIG. 2). The blower assembly 28 is connected by the shown fastener to the base. The hardfile 34 is also connected to the base. The DC cable 30 is connected from the power supply to the hardfile and backplane card 32. The fan assembly 36 is placed in the fan cradle and is also connected by conductor 88 to the power supply. The AC cable 38 is connected to the power supply and the connector portion for AC power is inserted into receptacle 90.

Turning to FIG. 2 for the moment, the gasket 56 is inserted in the bottom of the base in the area to be occupied by the larger card. The gasket 58 is inserted on the top surface of the front section 46'" in the area to be occupied by the large card. Similarly, the gasket 62 is inserted in the bottom of the base in the area to be occupied by the smaller card, and the gasket 60 is inserted in the upper surface in space alignment to the lower gasket 62. As can be seen, these gaskets help to provide EMC shielding when the card are inserted in the box. The assembled box, called Base Box 10, is now shown in FIG. 4A.

FIGS. 3A and 3B illustrate the cover 16 which is used to cover the box and the brackets 44 used to mount the box in a rack. The brackets are fastened to the side by fasteners such as screws 94. A set of horizontal slots identified by numerals 96 are fabricated in the back wall. A set of vertical slots identified by numerals 98 are fabricated in the front of the box. Preferably, the slots are approximately 13.7 mm wide.

Still referring to FIGS. 3A and 3B, the cover 16 is fabricated from a single sheet of metal with side walls 16'" and 16". Spaced holes identified by numerals 100 are fabricated on each side of the cover. Breathing slots identified by numerals 102 are also fabricated in the cover. Horizontal tabs identified by numeral 108 are fabricated on the back edge 110 of the cover. Likewise, vertical tabs 104 are fabricated on the front edge 106 of the cover. Conductive gaskets 112 and 114 are mounted to the inside surface of the cover. When the cover is mated with the lower portion of the device, the horizontal tabs 108 slides into the horizontal slots 96 on one wall of the base and the vertical tabs are placed in the slots on the other side of the base. Preferably, the horizontal slots are positioned along the front wall of the box and the vertical tabs are placed in the back wall of the box. Of course, the order of the slots could be reversed without deviating from the teachings of the present invention. It is clear from the above description that the EMC shielding in the box is provided by the gaskets 113, 115 in the cover, the fit between the slots in the base and the tabs on the cover and the lower gaskets 56, 62 and upper gaskets 58, 60 positioned in the respective card openings of the box.

Card assembly 14 could be an adapter card such as one which is connected to a network, etc., the appropriate electronics would be mounted on the card. Likewise, card assembly 12 could be a system card with appropriate electronics thereon. In addition, each card is provided with connectors 14" and 12" (FIG 4A). The connectors coact with like connectors labeled A, B, C and D when the cards are inserted in the box. In addition to the connectors which coact with the connectors in the backplane, connectors such as and 14'" are provided on the card. The connectors 14'" coact with conductors (not shown) to provide signals to the card or remove signals from the card. Each card has metal strip (FIG. 4B) running along its edges which coact with the previously described ESD ground clip on the card guide to ground the card. Each card is connected to its own adapter bracket identified by numerals 112 and 114, respectively. The adapter bracket 112 has two injector/ejector levers identified by numerals 116 and 118 at each end of the adapter bracket. As can be seen from FIG. 4A, adapter bracket 112 is associated with the large card referred to in the Compact-PCI® specification as 6U. The bracket 114, which is associated with the small card has one injector/ejector lever identified by numeral 118. This card is referred to as a 3U card. A grounding screw 120 is used for attaching and grounding the adapter bracket to the guide bracket when the card assembly 14 is inserted in the box. The injector/ejector lever also has grounding pins (116', 118' and 114') which coact with appropriate guide brackets for further grounding the adapter bracket. Each adapter bracket is fabricated with gaskets 120 and 122. When the card is inserted in the box, each of the gaskets 120 and 122 coact with the undersurface of the front of the box to further control electronic emissions from or into the box.

Still referring to FIG. 4A, electronic circuitry identified by numeral 124 are fabricated on card assembly 12. The electronic circuit 124 is such that, depending on the cooling requirement of the card, the blower voltage is changed so that the blower runs faster or slower to cool the card. In other words, the circuit adjusts the fan's speed depending on the cooling requirements of the card. The circuit would be in series with the fan voltage supply. For example, a hotter or higher power card would have a lower resistance thermal resistor circuit 124 installed so that the cooling devices would operate at a higher speed and would move more air over the card.

In operation, a user would insert a card along the card guide in the respective openings of the machine and pushes the card along the card guide until the connectors on the card are aligned with the connectors on the backplane. At this point, the operator uses the injector/ejector lever on each card to force the connectors into engagement. As will be described in details below, the injector/ejector lever mechanism has surfaces which coact with the respective guide brackets to force the connectors together and keep them mated or to eject the connectors when the card is to be removed from the box. By using a lever, a greater force is generated for mating or un-mating the connectors. This feature is particularly important if the connector has a large number of pins in it. Usually, the force required without the lever would be much greater. In some situations, the user may not be able to apply enough force to mate or un-mate the connectors. However, the injector/ejector mechanism makes mating easy even if the connectors have a large number of pins.

Figure 4B:
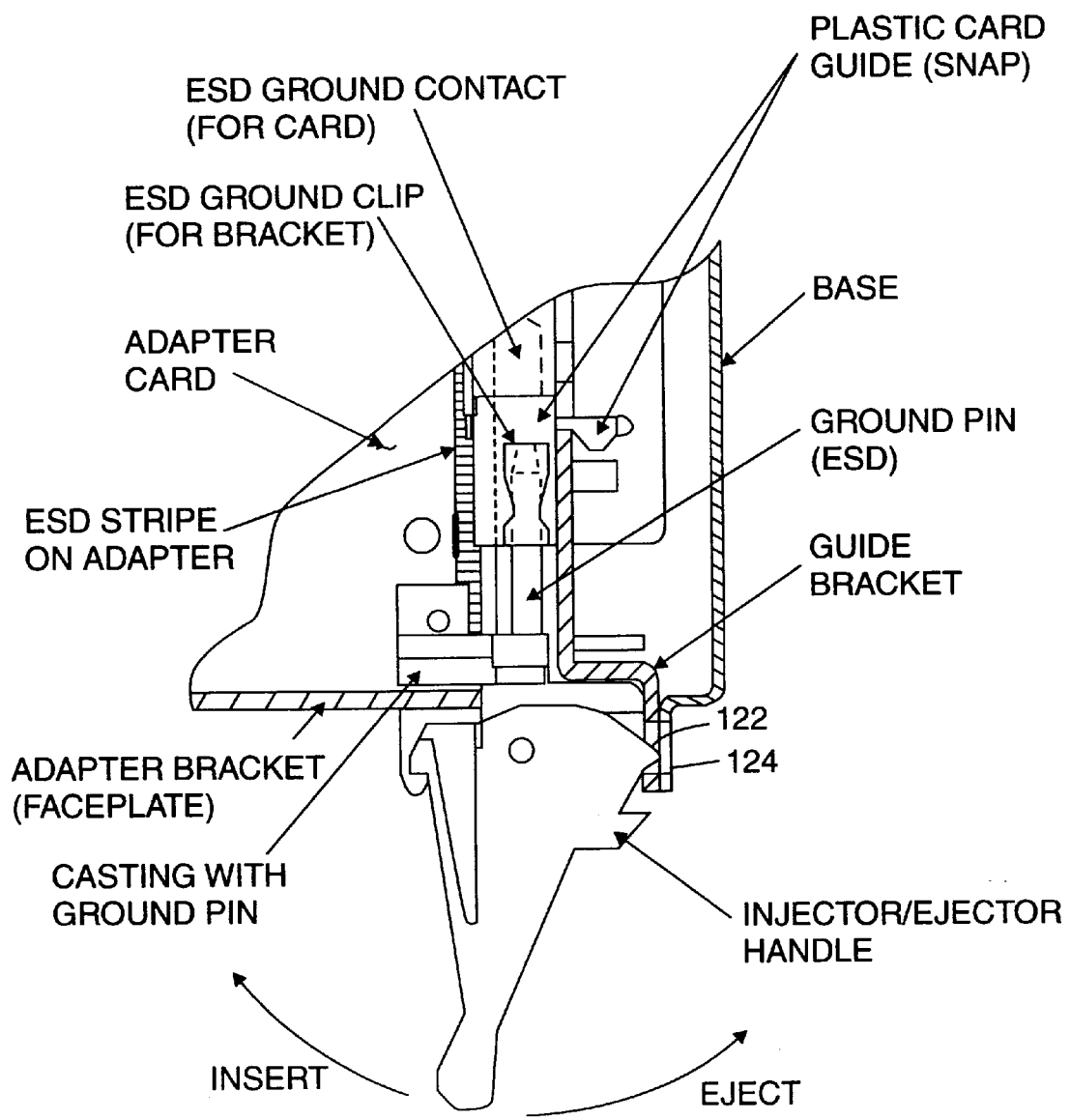
FIG. 4B shows a cross-section of the injector/ejector lever mechanism and its co-action with the card rail bracket.
Figure 5A:
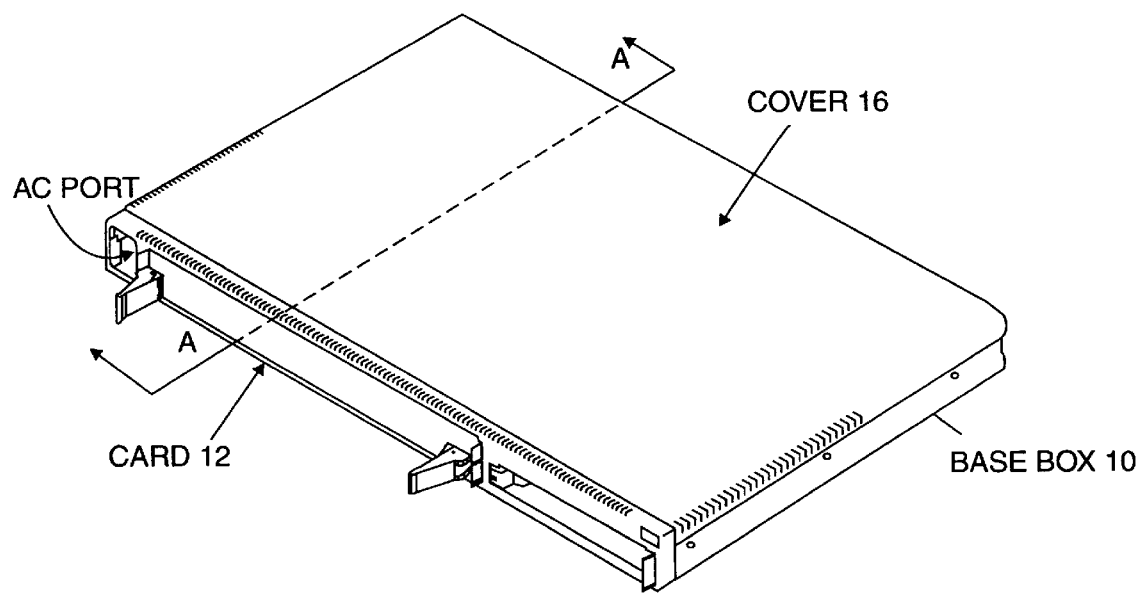
FIG. 5A shows a complete assembled machine.

FIG. 4B shows a cross section at the area where the injector/ejector mechanism lever coacts with guide brackets. With reference to FIG. 4A, if both cards were inserted in the box, the coaction shown in FIG. 4B would occur at three points (identified by numerals 78, 80 and 78) in FIG. 4A. Stated another way, the coaction occurs wherever the injector/ejector lever mates with the guide bracket. Because the junctions are identical, the showing in FIG. 4B is intended to cover all three in FIG. 4A.

Referring again to FIG. 4B, each of the surfaces are labeled and to insert the card so that the connector mates, the lever is moved in the direction shown by the arrow labeled insert. As the lever is moved in the insert direction, clockwise, the pin 122 moves through the hole 124 in the guide bracket and the connector on the backside of the card is inserted or mated with the connector on the backplane. Likewise, when the lever is moved in the counter-clockwise ejection direction, the pin is moved in the opposite direction and the connector on the card is ejected from the connector on the backplane. Thus, this mechanical assist device allows easy insert and removal of the connectors at the back of the card and the backplane in the machine. The relevant components, such as adapter card, adapter card faceplate, etc. at the cross-section are labeled in the figure.

Referring again to FIGS. 1, 2, 4A and 4B, when the card 12 and the card 14 are inserted in their respective openings in the weldment, the card connectors 12' on card assembly 112 are inserted into their respective connectors a, b, c by moving the injector/ejector levers 116 and 118 in the direction labeled insert (FIG. 4B). Similarly, the card connector 14" and card assembly 14 is inserted into connector d by moving injector/ejector lever 119 in the direction labeled insert in FIG. 4B. The pins labeled 116' and 118' are inserted into holes fabricated in guide bracket 52 and guide/fan bracket 50 to ground the card bracket 112 to the weldment. Similarly, screw 120 and pin 114' coact with holes in guide bracket 52 and guide/fan bracket 50 (FIG. 2) to ground card bracket 114 to the weldment. The injector/ejector levers 116, 118 and 119 coact with ends 78 of guide bracket 52, ends 80 of guide/fan bracket 50 and ends 78 of guide bracket 52 to create the mechanical force which seats the respective card connectors into the weldment connectors. As stated above, this feature is very important in that it allows for a relatively lesser force to be applied to the lever to create much greater force that is required for forcing the respective connectors into mating relationship. This is particularly important if the weldment connector has a large number of pins and a relatively high force is required to effectuate the mating relationship.

FIG. 5B shows a cross section AA across a fully assembled system shown in FIG. 5A, hereinafter referred to as the box. The box includes the base 10, a card inserted and cover 116. The cover 116 includes EMC gasket 114 and EMC gasket 112. The horizontal tabs 108 (only one of which is shown in FIG. 5B) is inserted in horizontal slot 98 in the base. Similarly, vertical tab 104 (only one of which is shown in FIG. 5B) is inserted into vertical slot 96 in the base 10. With the respective tabs on the cover inserted in the respective slots in the base, the cover is securely attached to the base.

Turning to FIG. 5C for the moment, detail A is shown. The detail shows an EMC gasket between cover 16 and the adapter bracket faceplate. Also, EMC spring is attached to the adapter faceplate. The EMC spring and the EMC gasket further coact with cover 16 to contain EMC interference inside the box and from entering from outside. In addition, EMC gasket 56 (FIG. 1) is also shown in detail A.

Several benefits are provided by the invention, including but not limited to the following:

A rugged low-profile box that can be rack mounted even in tight spaces is provided.

The box complies with strict EMC requirements such as those specified by FCC

Part 15 and CISPR 22.

The box accepts CompactPCI form factor cards and meets other CompactPCI® requirements.

The box allows easy insertion/ejection of the cards.

The enclosure is low-cost and easy to manufacture alternative to extruded aluminum boxes on the market.

The cooling is adjustable and changes based upon the amount of heat generated by the card that is inserted in the box.

While the invention has been particularly shown and described with reference to preferred embodiment thereof, it will be understood by those skilled in the art that the foregoing and changes in form and detail may be made therein without departing from the spirit and scope of the invention.

What is claimed is:

1. A computer assembly including:
    a base section including a bottom surface, upstanding sidewalls with at least one opening, through which electronic subassemblies can be inserted and removed, fabricated in one of the sidewalls and extension tabs (68, 70, 72) dispose in spaced relationship relative to the at least one opening;
    said one of the sidewalls further shaped into a substantially flat surface and adjoining vertical surface, a plurality of spaced horizontal slots fabricated in the vertical surface;
    a plurality of spaced vertical slots fabricated in another sidewall, opposite said one of the sidewalls;
    a support member connected to the base section; and
    a plurality of brackets for guiding the electronic subassemblies arranged in spaced relationship and extending from the opening to said support member with each bracket having a first end being connected to one of the extension tabs and a second end being connected to the support member.

2. The computer assembly of claim 1 further including a cover section having a flat surface, at least two displaced sidewalls fabricated along two opposite sides of the cover section, a first set of tabs for mating with the horizontal slots fabricated along another side of said cover section and a second set of tabs for mating with the vertical slots fabricated on yet another side of said cover section opposite to the another side.

3. The computer assembly of claim 1 or claim 2 further including cooling vents fabricated in the cover section and base section.

4. The computer assembly of claim 1 or 2 further including guide rails for mounting on each of the plurality of brackets.

5. The computer assembly of claim 1 or 2 further including a power supply mounted to the base section;
    a power supply cover mounted to the base section and cover said power supply;
    a first fan assembly mounted to the base section; and
    a hard disk file assembly mounted to the base section.

6. The computer assembly of claim 1 or 2 further including a backplane card connected to the support member.

7. The computer sub-assembly of claim 1 further including at least one electrical grounding pin connected to at least one of the plurality of brackets.

8. The computer assembly of claim 5 further including electrical wiring for connecting the power supply to the first fan assembly and the hard disc file assembly.

9. The computer assembly of claim 5 further including a second fan assembly mounted to the base station.

10. The computer assembly of claim 5 further including an insulator mounted between the base section and the power supply.

11. The computer assembly of claim 6 further including an insulator mounted between the support member and the backplane card.

12. The computer assembly of claim 6 wherein the backplane card includes electrical connector for mating with other electrical connectors and electrical wiring for interconnecting the electrical connectors on said backplane.

13. The computer assembly of claim 11 further including an electronic circuit board subassembly being inserted through the opening into a space provided in said base section.

14. The computer assembly of claim 13 wherein the electronic circuit board subassembly including a circuit board supporting electrical circuitry to perform a desired function;
   at least one electrical connector connected to the circuit board; and
   a lever subassembly for injecting and/or ejecting the circuit board into and/or from the backplane connected to the circuit board.

15. The computer sub-assembly of claim 13 further including a circuit arrangement for adjusting a speed of the first fan assembly as a function of cooling requirements of said electronic circuit board sub-assembly.

16. An electronic subassembly for use in a computer system including:
   a circuit board including interconnected electronic components;
   a first set of electrical connectors mounted on the circuit board; said first set of electrical connectors operable for mating with a first set of off-board connectors;
   a bracket connected to the circuit board; and
   at least one injector/ejector lever mechanism for positioning the circuit board connected to the bracket.

17. The electronic subassembly of claim 16 further including a second set of electrical connectors for mating with a second set of off-board electrical conductors mounted on said circuit board.

18. The electronic sub-assembly of claim 16 further including at least one conductive pin for electrical grounding connected to said bracket.

19. The electronic sub-assembly of claim 17 further including a metallic stripe for electrical grounding provided on said circuit board.

20. A system for use in a communications network infrastructure including:
   a base section including a bottom surface and sidewalls with at least one opening in one of the sidewalls;
   at least one horizontal slot fabricated in the one of the sidewalls;
   at least one vertical slot fabricated in another one of the sidewalls opposite the one of the sidewalls;
   a support member connected to the base section;
   guiding mechanism connected to the support member and the base section;
   a backplane card connected to the support member; said backplane card carrying a plurality of connectors;
   at least one circuit board assembly including electrical circuits, electrical connectors and injector/ejector mechanism inserted through the opening whereat said at least one circuit board assembly is being supported by said guiding mechanism with the electrical connectors being aligned with the connectors on the backplane;
   a power supply mounted to said base section;
   a blower assembly connected to said base section;
   electrical conductors interconnecting the power supply, the blower assembly and the circuit board assembly; and
   a cover having sidewalls connected to the sidewalls of the base section, at least one horizontal tab inserted in the horizontal slot and at least one vertical tab inserted in the at least one vertical slot.

21. An enclosure for housing electrical components including:
   A single sheet of material folded and cut to a desired form including a bottom, a plurality of sidewalls fabricated along the edges of the bottom, an opening fabricated in one of the sidewalls, a plurality of spaced tabs positioned relative to said opening at least one horizontal slot fabricated in the one of said sidewalls and at least one vertical slot fabricated in another of the sidewalls opposite said one of the sidewalls;
   a support member connected to the bottom; and
   a plurality of guide brackets positioned in spaced relationship relative to the opening wherein each guide bracket has one end connected to the support member and the other end connected to one of the spaced tabs.

22. The enclosure of claim 21 further including a cover section including at least two sidewalls for connecting to two of the plurality of sidewalls; at least one horizontal tab for inserting in the horizontal slot fabricated on said cover section; and
   at least one vertical tab for inserting in the vertical slot fabricated on said cover section.

* * * * *